(12) United States Patent
Kim et al.

(10) Patent No.: US 10,580,461 B2
(45) Date of Patent: Mar. 3, 2020

(54) SEMICONDUCTOR MEMORY DEVICE AND LAYOUT SCHEME OF GLOBAL LINES OVER PASS TRANSISTORS

(71) Applicant: SK hynix Inc., Gyeonggi-do (KR)

(72) Inventors: Jin-Ho Kim, Gyeonggi-do (KR); Sung-Lae Oh, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/054,465

(22) Filed: Aug. 3, 2018

(65) Prior Publication Data

US 2019/0295602 A1 Sep. 26, 2019

(30) Foreign Application Priority Data

Mar. 22, 2018 (KR) .................. 10-2018-0032959

(51) Int. Cl.
| | |
|---|---|
| *G11C 5/06* | (2006.01) |
| *G11C 11/4094* | (2006.01) |
| *G11C 11/419* | (2006.01) |
| *G11C 11/408* | (2006.01) |
| *G11C 11/4074* | (2006.01) |
| *G11C 11/418* | (2006.01) |
| *G11C 11/4096* | (2006.01) |

(52) U.S. Cl.
CPC .............. *G11C 5/063* (2013.01); *G11C 5/066* (2013.01); *G11C 11/4074* (2013.01); *G11C 11/4087* (2013.01); *G11C 11/4094* (2013.01); *G11C 11/4096* (2013.01); *G11C 11/418* (2013.01); *G11C 11/419* (2013.01)

(58) Field of Classification Search
CPC .................. H01L 27/11521; G11C 5/063
See application file for complete search history.

(56) References Cited

U.S. PATENT DOCUMENTS

| | | | | |
|---|---|---|---|---|
| 9,595,331 | B1* | 3/2017 | Lee | ................. G11C 16/08 |
| 10,388,663 | B2* | 8/2019 | Oh | ................. H01L 29/1037 |
| 2012/0257452 | A1* | 10/2012 | Kim | ................. G11C 16/0483 365/185.11 |
| 2013/0250683 | A1* | 9/2013 | Hosono | ................. G11C 16/0483 365/185.05 |
| 2014/0056071 | A1* | 2/2014 | Choi | ................. G11C 5/02 365/185.11 |
| 2016/0086669 | A1* | 3/2016 | Kim | ................. G11C 5/063 365/185.11 |
| 2016/0276261 | A1* | 9/2016 | Oh | ................. H01L 27/11565 |
| 2017/0330886 | A1* | 11/2017 | Lee | ................. G11C 16/04 |

FOREIGN PATENT DOCUMENTS

| | | |
|---|---|---|
| KR | 101083680 | 11/2011 |
| KR | 1020140126503 | 10/2014 |

* cited by examiner

*Primary Examiner* — Mushfique Siddique
(74) *Attorney, Agent, or Firm* — IP & T Group LLP

(57) ABSTRACT

A semiconductor memory device includes a plurality of pass transistors disposed along a first direction over a substrate, and configured to transfer operating voltages to a memory cell array; and a plurality of global lines formed in a first wire layer over the pass transistors, extending in a second direction intersecting with the first direction, and configured to transfer the operating voltages to the corresponding pass transistors respectively. The global lines are disposed in first direction pitches of some pass transistors among the pass transistors.

18 Claims, 12 Drawing Sheets

SEMICONDUCTOR MEMORY DEVICE AND LAYOUT SCHEME OF GLOBAL LINES OVER PASS TRANSISTORS

CROSS-REFERENCE TO RELATED APPLICATION

The present application claims priority to Korean Patent Application No. 10-2018-0032959 filed in the Korean Intellectual Property Office on Mar. 22, 2018, which incorporated herein by reference in its entirety.

BACKGROUND

1. Technical Field

Various embodiments generally relate to a semiconductor memory device and, more particularly, to a semiconductor memory device including pass transistors.

2. Related Art

A semiconductor memory device a memory device using semiconductor such as silicon (Si), germanium (Ge), gallium arsenide (GaAs) and indium phosphide (InP), and includes a volatile memory device and a nonvolatile memory device.

A volatile memory device loses data stored therein when power interrupted. Examples of a volatile memory device include an SRAM (static random access memory), a DRAM (dynamic RAM), and an SDRAM (synchronous DRAM). A nonvolatile memory device retains data stored therein even when power interrupted. Examples of a nonvolatile memory device include a ROM (read only memory), a PROM (programmable ROM), an EPROM (electrically programmable ROM), an EEPROM (electrically erasable and programmable ROM), a flash memory, a PRAM (phase change RAM), an MRAM (magnetic RAM), an RRAM (resistive RAM), and an FRAM (ferroelectric RAM).

SUMMARY

Various embodiments of the present invention relate to an improved semiconductor memory device.

In an embodiment, a semiconductor memory device may include: a plurality of pass transistors disposed along a first direction over a substrate, and configured to transfer operating voltages to a memory cell array; and a plurality of global lines formed in a first wire layer over the pass transistors, extending in a second direction intersecting with the first direction, and configured to transfer the operating voltages to the corresponding pass transistors respectively. The global lines may be disposed in only some pass transistors pitches in the first direction.

In an embodiment, a semiconductor memory device may include: a plane disposed over a substrate, and including a memory cell array and a row decoder; and a peripheral circuit disposed adjacent to the plane in a second direction intersecting with a first direction, over the substrate. The row decoder may include a plurality of pass transistors disposed along the first direction, and configured to transfer operating voltages to the memory cell array; and a plurality of global lines formed in a first wire layer over the pass transistors, extending in the second direction, and configured to transfer the operating voltages to the corresponding pass transistors respectively. The global lines may be disposed in first direction pitches of some pass transistors, and may not be disposed in first direction pitches of remaining pass transistors.

In an embodiment, a semiconductor memory device may include: a plurality of pass transistors disposed along a first direction over a substrate, and configured to transfer operating voltages to a memory cell array; and a plurality of global lines formed in a first wire layer over the pass transistors, extending in a second direction intersecting with the first direction, and configured to transfer the operating voltages to the corresponding pass transistors respectively. A first direction pitch of the global lines may be smaller than a first direction pitch of the pass transistors.

In an embodiment, a semiconductor memory device may include: first and second pass transistors disposed along a first direction over a substrate, and configured to transfer operating voltages to a memory cell array; and at least two global lines formed in a first wire layer over the first pass transistor, extending in a second direction intersecting with the first direction, and configured to transfer the operating voltages to the corresponding pass transistors respectively. The global lines are disposed over the first pass transistor and not disposed over the second pass transistor.

The at least two global lines may include: first global line corresponding to the first pass transistor; and second global line corresponding to the second pass transistor.

The semiconductor memory device may further include: first coupling line formed in a second wire layer between the pass transistors and the first wire layer, and electrically coupled with the first pass transistor and the first global line; and second coupling line formed in the second wire layer between the pass transistors and the first wire layer, and electrically coupled with the second pass transistor and the second global line. The second coupling line extends in the first direction.

The first coupling line may be formed within an area of the first pass transistor and the second coupling line formed to extend from the area of the first transistor to an area of the second pass transistor.

The semiconductor memory device may further include: metal line extending in the second direction and configured to transmit signals other than the operating voltages. The metal line may be disposed over the second pass transistor.

The metal line may be configured to transfer power or signal other than the operating voltages.

The semiconductor memory device may further include: a shielding line formed in the first wire layer and disposed adjacent to the metal line.

The shielding line may be disposed between the metal line and the global lines formed over the first pass transistor.

A ground voltage may be provided to the shielding line.

DETAILED DESCRIPTION

Figure 1:
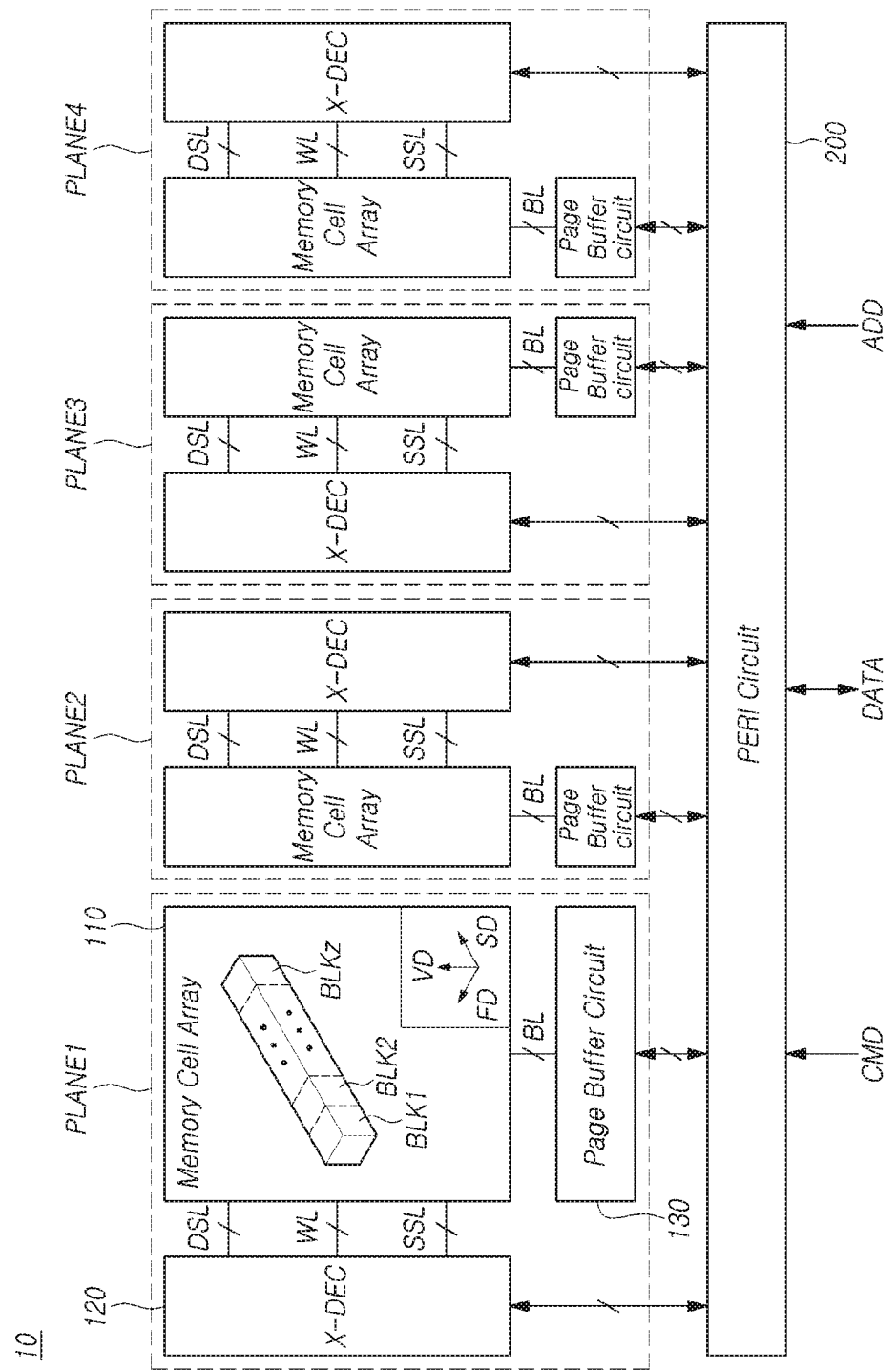
FIG. 1 a block diagram illustrating a semiconductor memory device in accordance with an embodiment of the present invention.

Hereinafter, a semiconductor memory device will be described below with reference to the accompanying drawings through various examples of embodiments.

The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It to be understood that embodiments of the present invention are not limited to the particulars shown in the drawings, that the drawings are not necessarily to scale, and, in some instances, proportions may have been exaggerated in order to more clearly depict certain features of the invention. While particular terminology used, it to be appreciated that the terminology used for describing particular embodiments only and not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, the term "and/or" includes any and all combinations of one or more of the associated listed items.

As used herein, singular forms are intended to include the plural forms as well, unless the context clearly indicates otherwise.

It will be further understood that the terms "includes," and "including" are used interchangeably in this specification with the open-ended terms "comprises," and "comprising," to specify the presence of any stated elements and to not preclude the presence or addition of one or more other non-stated elements.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

Also, as used herein, the term "and/or" includes any and all combinations of one or more of the associated listed items.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

It also noted, that in some instances, as would be apparent to those skilled in the relevant art, a feature or element described in connection with one embodiment may be used singly or in combination with other features or elements of another embodiment, unless otherwise specifically indicated Hereinbelow, in the accompanying drawings, a direction vertically projecting from the top surface of a substrate defined as a vertical direction VD, and two directions parallel to the top surface of the substrate and intersecting with each other are defined as a first direction FD and a second direction SD, respectively. The first direction FD may correspond to the extending direction of bit lines, and the second direction SD may correspond to the extending direction of the row lines. The first direction FD and the second direction SD may intersect substantially perpendicular to each other. In the drawings, a direction indicated by an arrow and a direction opposite thereto represent the same direction.

In the following embodiments, an n-type metal may be defined as a metal which used in an NMOS (n-type metal oxide semiconductor) transistor, and a p-type metal may be defined as a metal which used in a PMOS (p-type metal oxide semiconductor) transistor.

FIG. 1 a block diagram illustrating a semiconductor memory device 10 in accordance with an embodiment of the present invention.

Referring to FIG. 1, the semiconductor memory device 10 in accordance with the embodiment may include a plurality of planes PLANE1 to PLANE4 and a peripheral circuit 200. The semiconductor memory device 10 in accordance with the embodiment may have a four-plane structure.

While it illustrated in the embodiment of FIG. 1 that the semiconductor memory device 10 includes four-planes, it to be noted that the number of planes included in the semiconductor memory device 10 not limited thereto. Generally, the semiconductor memory device 10 may include n (n a natural number) number of planes, wherein n a positive integer.

Each of the planes PLANE1 to PLANE4 may include a memory cell array 110, a row decoder 120 and a page buffer circuit 130.

The memory cell array 110 may include a plurality of memory blocks BLK1 to BLKz (z a natural number of 2 or more). Each of the memory blocks BLK1 to BLKz may be coupled to the row decoder 120 through at least one drain select line DSL, a plurality of word lines WL and at least one source select line SSL. The memory blocks BLK1 to BLKz may be coupled to the page buffer circuit 130 through bit lines BL.

The drain select line DSL, the word lines WL and the source select line SSL may be provided for each of the memory blocks BLK1 to BLKz, and the bit lines BL may be provided in common for the memory blocks BLK1 to BLKz.

Each of the memory blocks BLK1 to BLKz may include a plurality of cell strings. Each of the cell strings may include at least one drain select transistor, a plurality of memory cells and at least one source select transistor which are coupled in series. The memory cells may be nonvolatile memory cells.

The row decoder 120 may select any one among the memory blocks BLK1 to BLKz included in the memory cell array 110, in response to a row address provided from the peripheral circuit 200. The row decoder 120 may transfer the operating voltages provided from the peripheral circuit 200, to the drain select line DSL, the word lines WL and the source select line SSL which are coupled to a selected memory block.

The page buffer circuit 130 may include a plurality of page buffers (not shown) which are coupled to the bit lines BL, respectively. The page buffer circuit 130 may select a bit line BL in response to a column address. The page buffer circuit 130 may receive data from an external device, for example, a memory controller, through the peripheral circuit 200, and may store the received data in the memory cell array 110. The page buffer circuit 130 may read data from the memory cell array 110, and may output the read data to the external device through the peripheral circuit 200.

While not shown, the peripheral circuit 200 may include an input/output circuit, a voltage generator and a control logic.

The input/output circuit may be coupled with the row decoders 120 and the page buffer circuits 130 of the planes PLANE1 to PLANE4. The input/output circuit may include a global buffer which temporarily stores a command CMD, an address ADD and data DATA received from the external device. The page buffer circuits 130 of the plurality of planes PLANE1 to PLANE4 may share one global buffer which included in the input/output circuit.

The voltage generator may generate various voltages which are required in the semiconductor memory device 10. For example, the voltage generator may generate program voltages, pass voltages, select read voltages and unselect read voltages.

The control logic may be coupled to the row decoders 120 and the page buffer circuits 130 of the planes PLANE1 to PLANE4, the voltage generator and the input/output circuit. The control logic may control the general operations (program/read/erase operations) of the semiconductor memory device 10. The control logic may operate in response to the command CMD from the external device.

Figure 2:
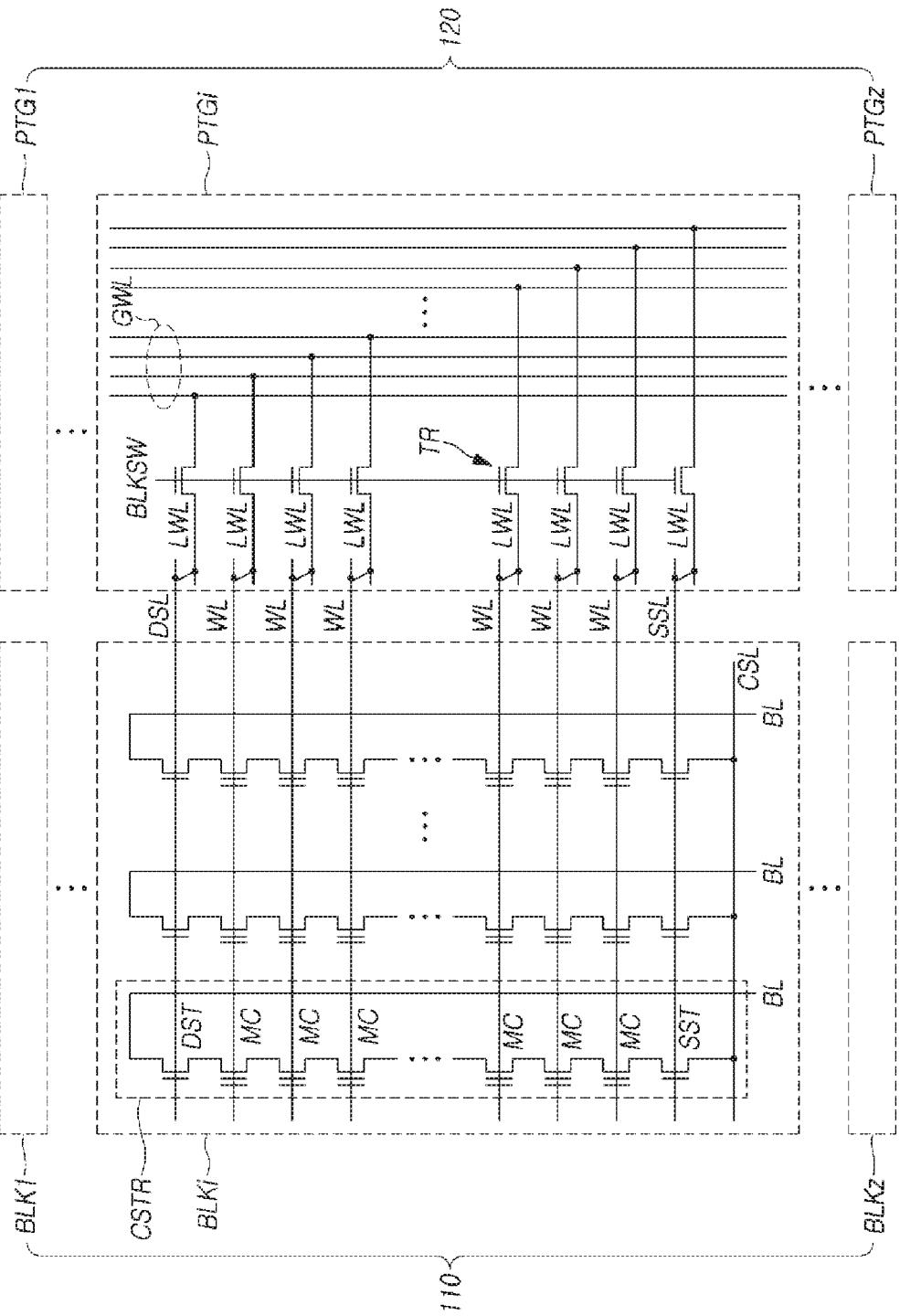
FIG. 2 a circuit diagram illustrating the schematic configurations of a memory cell array and a row decoder employed in the semiconductor memory device shown in FIG. 1.

FIG. 2 a circuit diagram illustrating the schematic configurations of the memory cell array 110 and the row decoder 120 shown in FIG. 1.

Referring to FIG. 2, the memory cell array 110 may include a plurality of memory blocks BLK1 to BLKz. Each of the memory blocks BLK1 to BLKz may correspond to erase unit. The memory blocks BLK1 to BLKz may be configured in the same manner with one another.

Each of the memory blocks BLK1 to BLKz may include a plurality of cell strings CSTR which are coupled between a plurality of bit lines BL and a common source line CSL. Each of the cell strings CSTR may include a drain select transistor DST which coupled to a bit line BL, a source select transistor SST which coupled to the common source line CSL, and a plurality of memory cells MC which are coupled between the drain select transistor DST and the source select transistor SST. The memory cells MC may be a structure including a floating gate and a control gate.

The plurality of cell strings CSTR included in each of the memory blocks BLK1 to BLKz may be coupled in common to the common source line CSL. Each of the cell strings CSTR may be coupled to a corresponding bit line BL.

The gates of drain select transistors DST may be coupled to a drain select line DSL. The gates of the memory cells MC may be coupled to corresponding word lines WL, respectively. The gates of source select transistors SST may be coupled to a source select line SSL. The drain select line DSL, the word lines WL and the source select line SSL may be coupled to local lines LWL, respectively.

The row decoder 120 may include a plurality of pass transistor groups PTG1 to PTGz corresponding to the memory blocks BLK1 to BLKz, respectively. Each of the pass transistor groups PTG1 to PTGz may include a plurality of pass transistors TR which are coupled between global lines GWL and local lines LWL. The pass transistors TR may transfer the operating voltages loaded on the global lines GWL to a corresponding memory block through the local lines LWL in response to a block select signal BLKSW. The local lines LWL may be provided for each of the pass transistor groups PTG1 to PTGz, and the global lines GWL may be provided in common for the pass transistor groups PTG1 to PTGz. The pass transistor groups PTG1 to PTGz may share the global lines GWL.

Hereinbelow, in the accompanying drawings, a direction perpendicular to the top surface of a substrate defined as a vertical direction VD, and two directions parallel to the top surface of the substrate and intersecting with each other are defined as a first direction FD and a second direction SD, respectively. The first direction FD and the second direction SD may intersect perpendicularly to each other. In the drawings, a direction indicated by an arrow and a direction opposite thereto represent the same direction.

Figure 3:
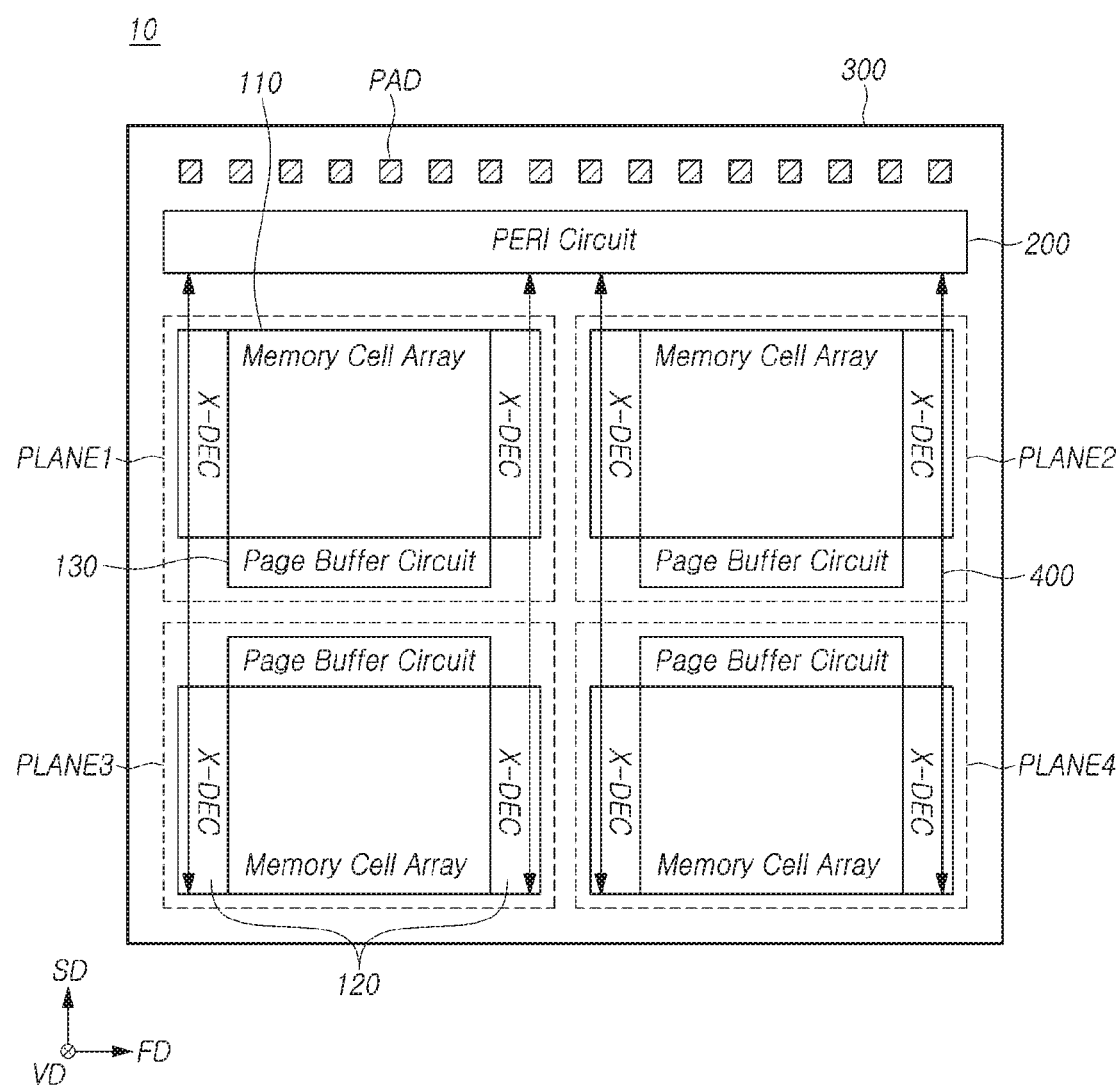
FIG. 3 a layout diagram illustrating the semiconductor memory device in accordance with an embodiment of the present invention.

FIG. 3 a layout diagram illustrating the semiconductor memory device 10 in accordance with the embodiment.

Referring to FIG. 3, a plurality of planes PLANE1 to PLANE4, a peripheral circuit 200 and input/output pads PAD may be disposed on a substrate 300.

The input/output pads PAD as the external contacts of the semiconductor memory device 10 for electrical coupling with an external device may be coupled to a printed circuit board (not shown) through, for example, wires. In this case, while not shown, first ends of each of the wires may be bonded to an input/output pad PAD, and the second ends of each of the wires may be bonded to a bond finger of the printed circuit board.

The input/output pads PAD may be disposed adjacent to an edge of the substrate 300 along the first direction FD. The input/output pads PAD may be spaced apart along the first direction FD at a regular interval. The input/output pads PAD may form a single row along the first direction FD as illustrated in FIG. 3, however, the invention not limited in this way. For example, in an embodiment, the input/output pads PAD may be arranged in two or more rows at the edge of the substrate 300. Disposing the input/output pads PAD adjacent to the edge of the substrate 300 is advantageous because the length of the wires which couple the input/output pads PAD and the printed circuit board can be minimized.

The peripheral circuit 200 may be disposed adjacent to the input/output pads PAD in the second direction SD. The peripheral circuit 200 may be coextensive with the row of the input/output pads PAD in the first direction FD. While not shown, the peripheral circuit 200 may be electrically coupled to the input/output pads PAD through a plurality of wiring lines.

The planes PLANE1 to PLANE4 may be disposed on the opposite side of the input/output pads PAD when viewed from the peripheral circuit 200. The semiconductor memory device 10 in accordance with the embodiment of FIG. 3 may have a four-plane structure. That to say, the semiconductor memory device 10 may include first to fourth planes PLANE1 to PLANE4.

The first to fourth planes PLANE1 to PLANE4 may be disposed in the form of a 2×2 matrix along the first direction FD and the second direction SD. The first and second planes PLANE1 and PLANE2 may be disposed adjacent to the peripheral circuit 200, and the third and fourth planes PLANE3 and PLANE4 may be disposed on the opposite side of the peripheral circuit 200 when viewed from the first and second planes PLANE1 and PLANE2.

Each of the first to fourth planes PLANE1 to PLANE4 may include a memory cell array 110, a row decoder 120 and a page buffer circuit 130.

The row decoder 120 may be disposed at both ends of the memory cell array 110 in the first direction FD. While it illustrated in the embodiment of FIG. 3 that the row decoder 120 disposed by being distributed to both ends of the memory cell array 110 in the first direction FD, it to be noted that the embodiment not limited thereto. For example, the row decoder 120 may be disposed at only one end of the memory cell array 110 in the first direction FD. The page buffer circuit 130 may be disposed at an end of the memory cell array 110 in the second direction SD.

The row decoder 120 and the page buffer circuit 130 may be coupled to the peripheral circuit 200 through a plurality of global lines (not shown) and a plurality of metal lines 400.

The row decoder 120 may include a plurality of pass transistor groups (PTG1 to PTGz of FIG. 2). Each of the pass transistor groups may include a plurality of pass transistors (TR of FIG. 2). The pass transistors may transfer the operating voltages loaded in global lines (GWL of FIG. 2), to the memory cell array 110. While not shown, the global lines may extend in the second direction SD and may overlap with the pass transistors in the vertical direction VD.

The global lines may transfer operating voltages to the pass transistors of the row decoder 120. The metal lines 400 may transfer signals other than the operating voltages.

The metal lines 400 may include power lines which transmit power such as a power supply voltage and a ground voltage, and signal lines which transmit signals other than power, such as, for example, data, a command and an address. The metal lines 400 may extend in the second direction SD and may overlap with the pass transistors of the row decoder 120 in the vertical direction VD.

Since both the global lines and the metal lines 400 are disposed to overlap with the pass transistors of the row decoder 120, the gap between a global line and a metal line 400 (a power line or a signal line) may be narrow.

In this case, as the coupling capacitance between the global line and the metal line 400 increases, noise may occur in a signal transmitted through the metal line 400 (the signal line) under the influence of an operating voltage transmitted through the global line, and thus the signal may be distorted. Otherwise, the level of an operating voltage transmitted through the global line may be undesirably changed under the influence of power transmitted through the metal line 400 (the power line), and thus the operation characteristics and reliability of the semiconductor memory device 10 may deteriorate.

In order to prevent such problems, it may be necessary to increase the gap between the global line and the meta line 400.

If the metal lines 400 are disposed not to overlap with the pass transistors in the vertical direction VD and an area increased or a wire layer added to dispose the metal lines 400, the gap between the global line and the metal line 400 may be increased. However, if an area increased or a wire layer added, a problem may be caused in that the size of the semiconductor memory device 10 increases.

Embodiments of the present disclosure suggest a semiconductor memory device capable of increasing the gap between a global line and a metal line without increasing a size.

Figure 4:
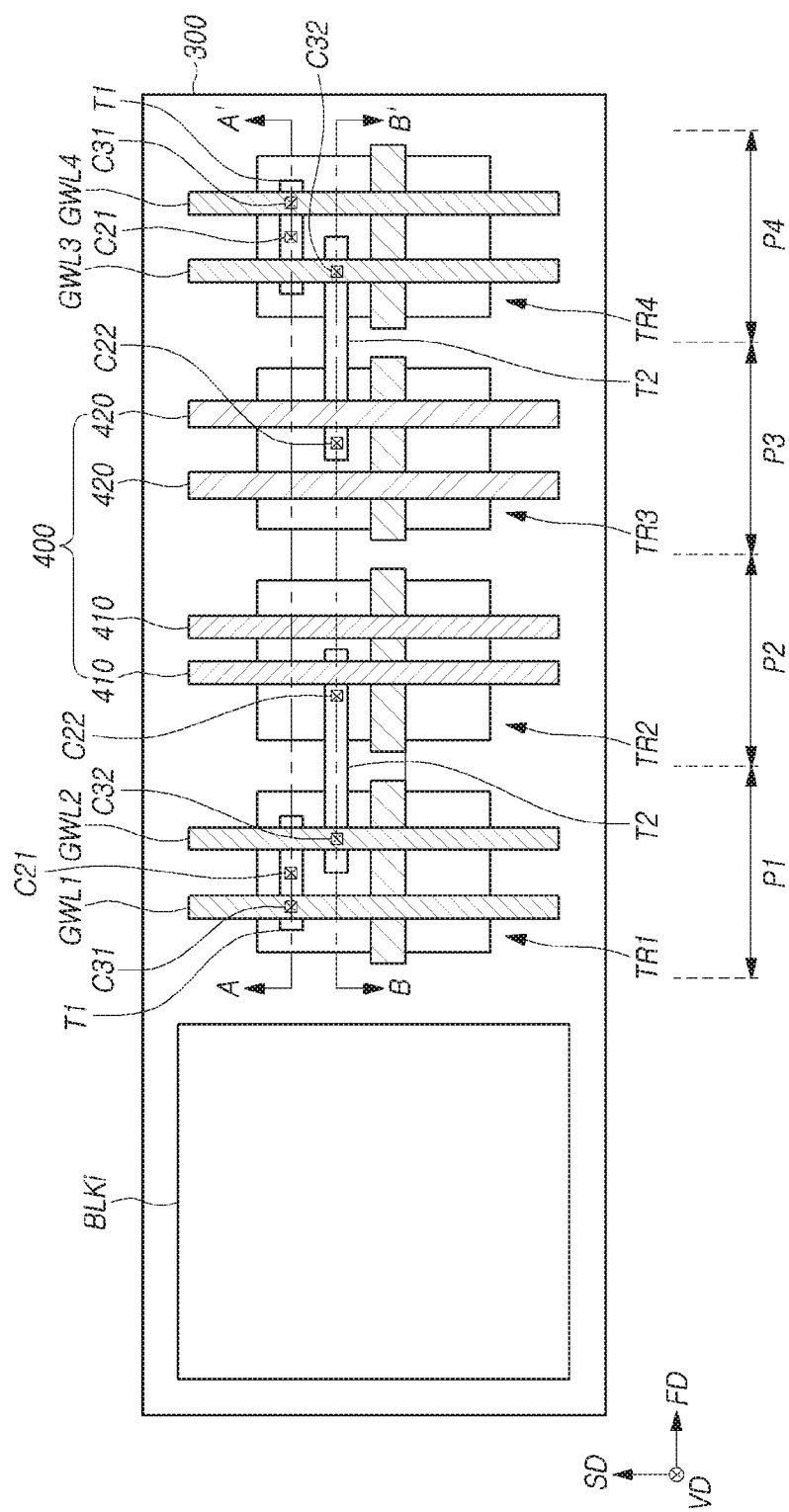
FIG. 4 a layout diagram illustrating a configuration of a part of the row decoder in accordance with an embodiment of the present invention.
Figure 5:
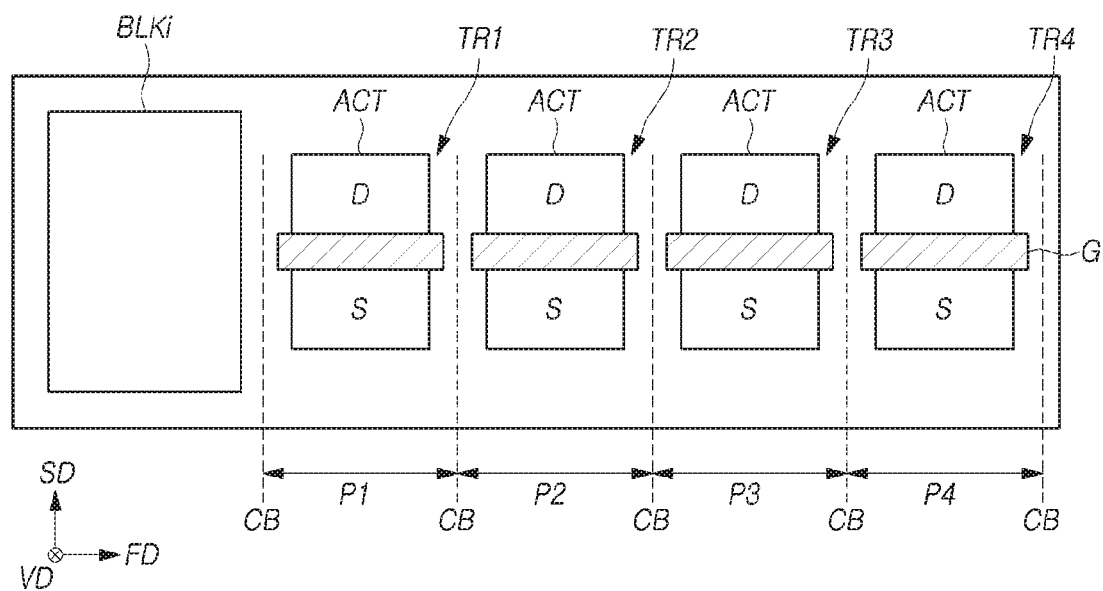
FIG. 5 a top view illustrating pass transistors of FIG. 4.

FIG. 4 a layout diagram illustrating a part of the row decoder in accordance with an embodiment of the present invention. FIG. 5 a top view illustrating the pass transistors of FIG. 4, and FIG. 6 a top view illustrating the global lines and the metal lines of FIG. 4.

Referring to FIGS. 4 and 5, a memory block BLKi may be formed on a substrate 300, and a plurality of pass transistors TR1 to TR4 may be formed in the substrate 300 on one side of the memory block BLKi. The pass transistors TR1 to TR4 may be disposed along the first direction FD. The pass transistors TR1 to TR4 may be spaced apart at a regular interval along the first direction FD.

The pass transistors TR1 to TR4 may configure a pass transistor group (PTGi of FIG. 2) corresponding to the memory block BLKi. The pass transistors TR1 to TR4 may transfer operating voltages to the memory block BLKi. While the embodiment illustrates 4 pass transistors TR1 to TR4 configuring a pass transistor group, it is to be noted that embodiments are not limited thereto. Generally, the present disclosure may include all cases where a pass transistor group configured to have two or more pass transistors.

While not shown, memory blocks (BLK1 to BLKz of FIG. 2) which configure a memory cell array (110 of FIG. 2) may be disposed along the second direction SD, and pass transistor groups (PTG1 to PTGz of FIG. 2) corresponding to the memory blocks (BLK1 to BLKz of FIG. 2) may be disposed along the second direction SD.

Boundaries CB (see FIG. 5) may be defined between pass transistors which are adjacent to each other in the first direction FD.

Figure 7:
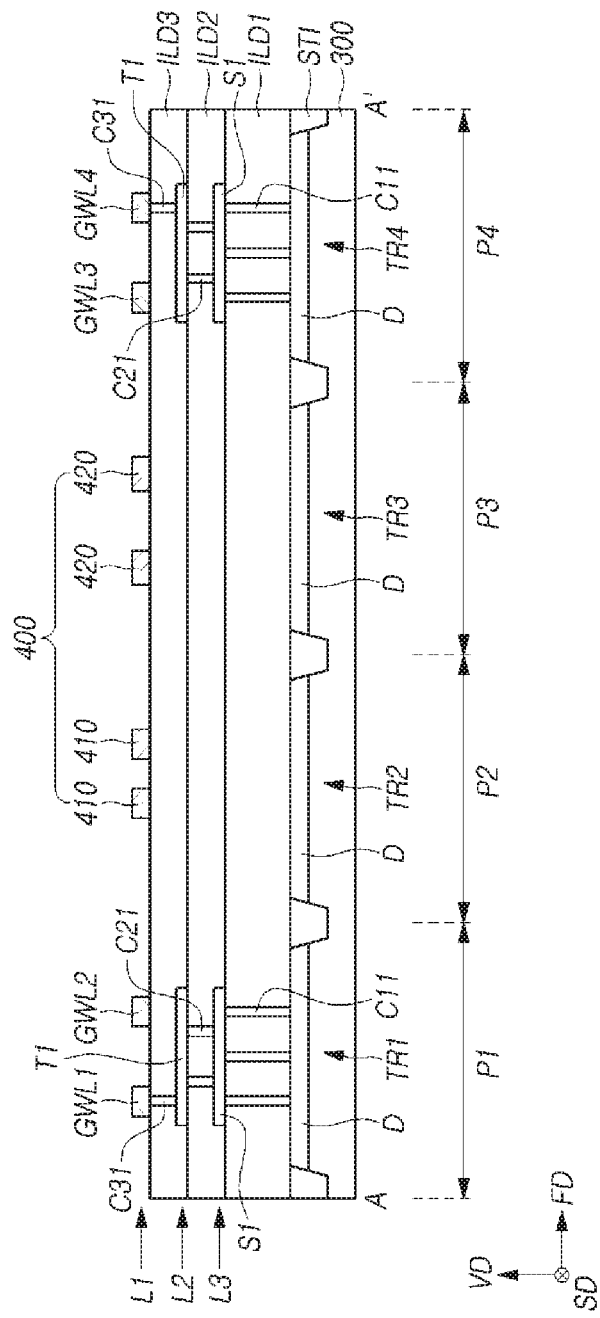
FIG. 7 a cross-sectional view taken along the line A-A' of FIG. 4.

The pass transistors TR1 to TR4 may include active regions ACT which are isolated from one another by isolation layers STI (see FIG. 7). Gates G are defined to extend across the centers of the respective active regions ACT, and, sources S and drains D may be defined as impurities are implanted into the active regions ACT on both sides of the gates G. The boundaries CB may correspond to the center lines of the isolation layers STI which isolate the active regions ACT from one another. In the present specification, a 'center line' means a line which extends in the second direction SD along the widthwise center of a component or a line which extends in the second direction SD along the center of the separation distance between components.

The separation distance between boundaries CB which neighbor each other in the first direction FD may be defined as the first direction pitch of a pass transistor. The first direction pitch of each pass transistor defined as the separation distance between the center lines of the isolation layers STI which are adjacent to each other in the first direction FD.

The first direction pitch of each pass transistor may be determined depending on the width of each active region ACT in the first direction FD and the width of isolation layers STI in the first direction FD, which are disposed at left and right sides, respectively, of the active region ACT. For example, the first direction pitch of each pass transistor may have a size corresponding to the sum of the width of each active region ACT in the first direction FD, half of the width of the isolation layer STI disposed on the left side of the active region ACT in the first direction FD, and half of the width of the isolation layer STI disposed on the right side of the active region ACT in the first direction FD.

The first direction pitches of the pass transistors TR1 to TR4 may be defined as first to fourth pitches P1 to P4, respectively. The first direction pitches of the pass transistors TR1 to TR4 may be the same with one another. In other words, the first to fourth pitches P1 to P4 may have the same size. The first to fourth pitches P1 to P4 may be implemented as various sizes as required.

While it illustrated in the embodiment that the pass transistors TR1 to TR4 which configure the pass transistor group (PTGi of FIG. 2) are disposed in a line along the first direction FD, it to be noted that the embodiment not limited thereto. For example, the pass transistors which configure the pass transistor group (PTGi of FIG. 2) may be provided in at least two lines along the first direction FD.

Figure 6:
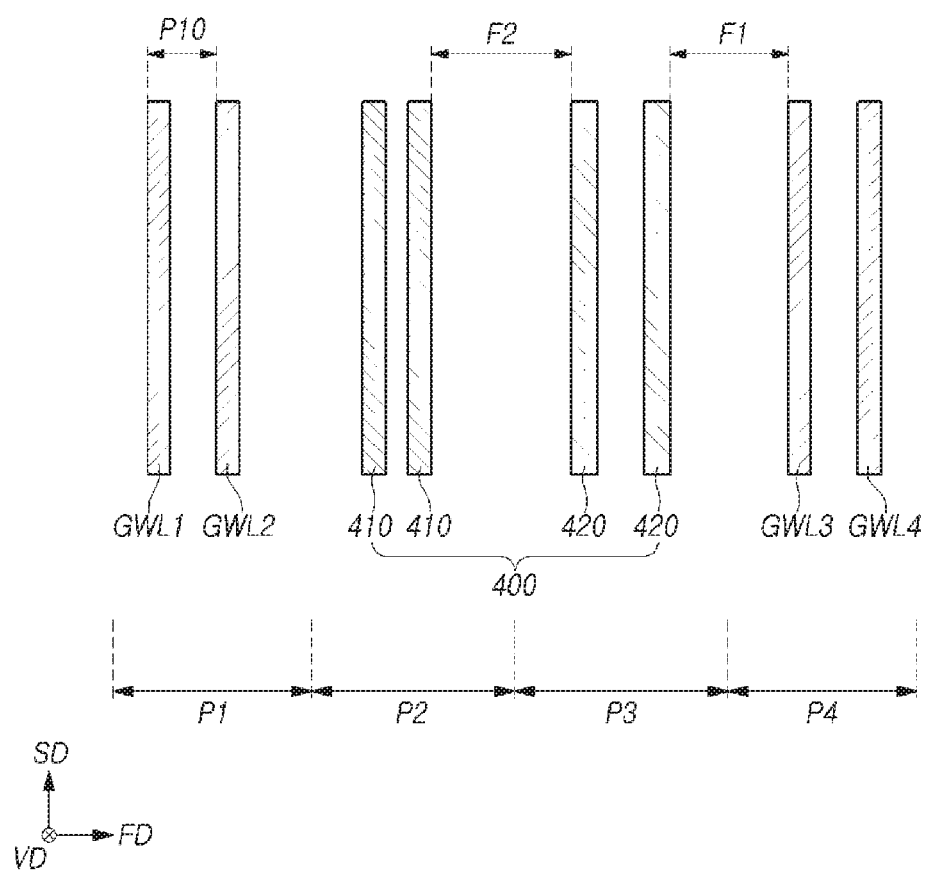
FIG. 6 a top view illustrating global lines and metal lines of FIG. 4.

Referring to FIGS. 4 to 6, a plurality of global lines GWL1 to GWL4 which extend in the second direction SD may be disposed over the pass transistors TR1 to TR4. The global lines GWL1 to GWL4 correspond to the pass transistors TR1 to TR4, respectively, and may be electrically coupled to the drains D, respectively, of the corresponding pass transistors TR1 to TR4. The global lines GWL1 to GWL4 may transfer operating voltages to the corresponding pass transistors TR1 to TR4.

The global lines GWL1 to GWL4 may be disposed in the first direction pitches P1 and P4 of some pass transistors TR1 and TR4 among the pass transistors TR1 to TR4. No global line disposed in the first direction pitches P2 and P3 of the remaining pass transistors TR2 and TR3. Due to this fact, the some pass transistors TR1 and TR4 overlap with the global lines GWL1 to GWL4 in the vertical direction VD, and the remaining pass transistors TR2 and TR3 do not overlap with the global lines GWL1 to GWL4 in the vertical direction VD.

Hereinbelow, for the sake of convenience in explanation, the pass transistors TR1 and TR4 which overlap with the global lines GWL1 to GWL4 are defined as first pass transistors, and the pass transistors TR2 and TR3 which do not overlap with the global lines GWL1 to GWL4 are defined as second pass transistors. Further, the global lines GWL1 and GWL4 corresponding to the first pass transistors TR1 and TR4 are defined as first global lines, and the global lines GWL2 and GWL3 corresponding to the second pass transistors TR2 and TR3 are defined as second global lines.

Pass transistors which do not overlap with the global lines GWL1 to GWL4, that is, the second pass transistors TR2 and TR3 may be successively disposed along the first direction FD. Pass transistors which overlap with the global lines GWL1 to GWL4, that is, the first pass transistors TR1 and TR4 may be disposed at both sides, respectively, of the second pass transistors TR2 and TR3.

While it illustrated in the embodiment that the two second pass transistors TR2 and TR3 are provided between the first pass transistors TR1 and TR4 which neighbor each other, it to be noted that the embodiment not limited thereto. For example, only one second pass transistor may be provided between first pass transistors, or at least three second pass transistors may be provided between first pass transistors.

The first global lines GWL1 and GWL4 may be disposed in the first direction pitches P1 and P4, respectively, of the corresponding first pass transistors TR1 and TR4. Namely, the first global line GWL1 may be disposed in the first direction pitch P1 of the first pass transistor TR1, and the first global line GWL4 may be disposed in the first direction pitch P4 of the first pass transistor TR4.

The second global line GWL2 may be disposed in the first direction pitch P1 of the first pass transistor TR1, and the second global line GWL3 may be disposed in the first direction pitch P4 of the first pass transistor TR4.

In the embodiment, in each of the first direction pitches P1 and P4 of the first pass transistors TR1 and TR4, there may be disposed one first global line GWL1 or GWL4 and one second global line GWL2 or GWL3. Each of the first pass transistors TR1 and TR4 may overlap with one first global line GWL1 or GWL4 and one second global line GWL2 or GWL3 in the vertical direction VD. No global line disposed in each of the first direction pitches P2 and P3 of the second pass transistors TR2 and TR3, and each of the second pass transistors TR2 and TR3 does not overlap with any global line in the vertical direction VD.

By this structure, a plurality of global lines GWL1 and GWL2 or GLW3 and GWL4 may be disposed in each of the first direction pitches P1 and P4 of the first pass transistors TR1 and TR4.

While it illustrated in the embodiment that the second pass transistors TR2 and TR3 are provided in the same number as the first pass transistors TR1 and TR4 and one second global line is provided in each of the first direction pitches P1 and P4 of the first pass transistors TR1 and TR4, it to be noted that the embodiment is not limited thereto. For example, the number of second pass transistors may be larger than the number of first pass transistors, and at least two second global lines may be provided in each of the first direction pitches P1 and P4 of the first pass transistors TR1 and TR4.

The global lines GWL1 to GWL4 may have the same width in the first direction FD, and adjacent global lines GWL1 and GWL2, and GLW3 and GWL4 may be separated by the same distance in the first direction FD. A first direction pitch P10 (see FIG. 6) of the global lines GWL1 to GWL4 may have a size corresponding to the sum of the width of a global line and the gap between adjacent global lines. The first direction pitch P10 of the global lines GWL1 to GWL4 has a size smaller than each of the first direction pitches P1 to P4 of the pass transistors TR1 to TR4. For example, the first direction pitch P10 of the global lines GWL1 to GWL4 may have a size corresponding to ½ to ⅙ of each of the first direction pitches P1 to P4 of the pass transistors TR1 to TR4.

Figure 8:
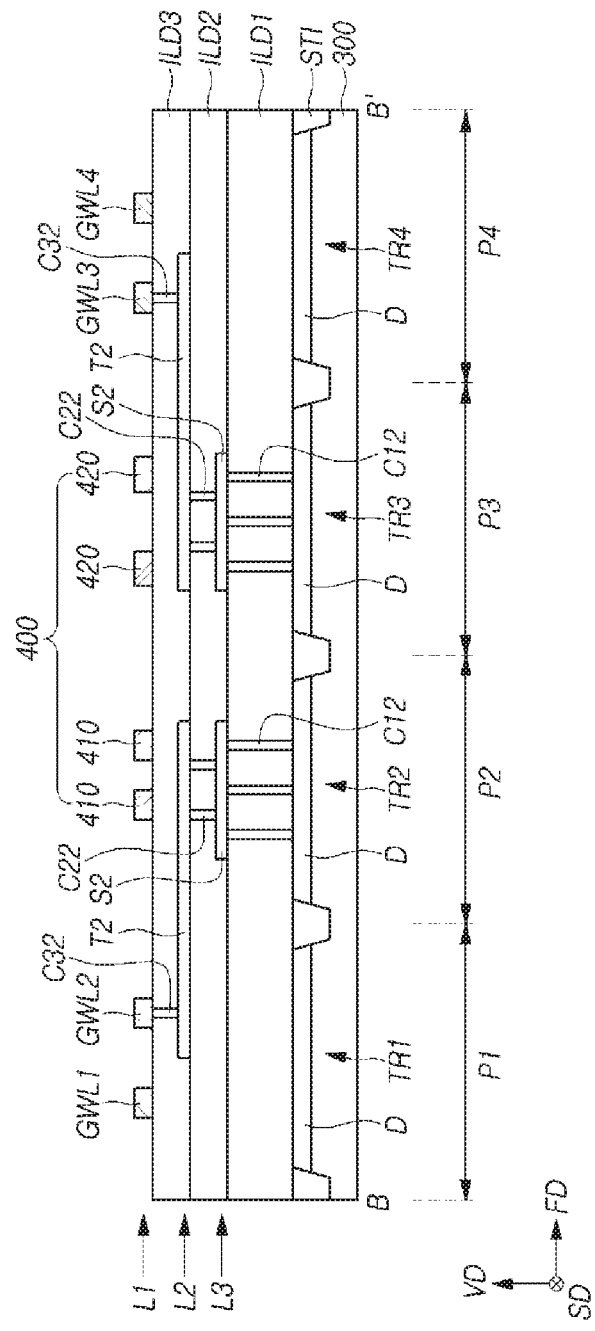
FIG. 8 a cross-sectional view taken along the line B-B' of FIG. 4.

FIG. 7 a cross-sectional view taken along the line A-A' of FIG. 4, and FIG. 8 a cross-sectional view taken along the line B-B' of FIG. 4.

Referring to FIGS. 4, 7 and 8, a multi-layer wire structure may be defined on the pass transistors TR1 to TR4. The multi-layer wire structure may include a plurality of wire layers L1, L2 and L3 which are separated from one another with dielectric layers ILD1, ILD2 and ILD3 interposed therebetween.

The wire layers L1, L2 and L3 may include a first wire layer L1, a second wire layer L2 below the first wire layer L1, and a third wire layer L3 below the second wire layer L2. The dielectric layers ILD1, ILD2 and ILD3 may include a first dielectric layer ILD1, a second dielectric layer ILD2 and a third dielectric layer ILD3 which are sequentially formed on the substrate 300.

The first dielectric layer ILD1 may cover the pass transistors TR1 to TR4 and the top surfaces of the substrate 300. The third wire layer L3 may be disposed on the first dielectric layer ILD1. The second dielectric layer ILD2 may cover the third wire layer L3 and the top surface of the first dielectric layer ILD1. The second wire layer L2 may be disposed on the second dielectric layer ILD2. The third dielectric layer ILD3 may cover the second wire layer L2 and the top surface of the second dielectric layer ILD2. The first wire layer L1 may be disposed on the third dielectric layer ILD3.

The global lines GWL1 to GWL4 may be formed at the first wire layer L1.

First coupling lines T1 corresponding to the first pass transistors TR1 and TR4, respectively, and second coupling lines T2 corresponding to the second pass transistors TR2 and TR3, respectively, may be formed at the second wire layer L2.

The first coupling lines T1 may have the first direction FD as the lengthwise direction thereof, and may be disposed within the first direction pitches P1 and P4 of the first pass transistors TR1 and TR4 respectively corresponding thereto. The first coupling lines T1 may overlap with the drains D of the first pass transistors TR1 and TR4 respectively corresponding thereto, in the vertical direction VD.

Each of the first coupling lines T1 may intersect with a corresponding one of the first global lines GWL1 and GWL4. A first contact C31 which passes through the third dielectric layer ILD3 may be formed where each of the first coupling lines T and a corresponding one of the first global lines GWL1 and GWL4 intersect with each other. Each of the first coupling lines T1 may be coupled to a corresponding one of the first global lines GWL1 and GWL4 through the first contact C31.

The second coupling lines T2 may have the first direction FD as the lengthwise direction thereof, and may extend from the insides of the first direction pitches P2 and P3 of the second pass transistors TR2 and TR3 respectively corresponding thereto to the insides of the first direction pitches P1 and P4 of the first pass transistors TR1 and TR4, respectively. First ends of the second coupling lines T2 may overlap with the drains D of the second pass transistors TR2 and TR3 respectively corresponding thereto in the vertical direction VD, and the second ends of the second coupling lines T2 may overlap with the drains D of the first pass transistors TR1 and TR4 in the vertical direction VD.

Each of the second coupling lines T2 may intersect with a corresponding one of the second global lines GWL2 and GWL3. A second contact C32 which passes through the third dielectric layer ILD3 may be formed where each of the second coupling lines T2 and a corresponding one of the second global lines GWL2 and GWL3 intersect with each other. Each of the second coupling lines T2 may be coupled to a corresponding one of the second global lines GWL2 and GWL3 through the second contact C32.

Third coupling lines S1 corresponding to the first pass transistors TR1 and TR4, respectively, and fourth coupling lines S2 corresponding to the second pass transistors TR2 and TR3, respectively, may be formed at the third wire layer L3.

The third coupling lines S1 may have the first direction FD as the lengthwise direction thereof, and may be disposed within the first direction pitches P1 and P4 of the first pass transistors TR1 and TR4 respectively corresponding thereto. Each of the third coupling lines S1 may overlap with a corresponding one of the first coupling lines T1 in the vertical direction VD. At least one third contact C21 which passes through the second dielectric layer ILD2 may be formed where each of the third coupling lines S1 and a corresponding one of the first coupling lines T1 overlap with each other. Each of the third coupling lines S1 may be coupled to a corresponding one of the first coupling lines T1 through the third contact C21.

The third coupling lines S1 may overlap with the drains D of the first pass transistors TR1 and TR4 respectively corresponding thereto, in the vertical direction VD. At least one fourth contact C11 which passes through the first dielectric layer ILD1 may be formed where each of the third coupling lines S1 and the drain D of a corresponding one of the first pass transistors TR1 and TR4 overlap with each other. Each of the third coupling lines S1 may be coupled to the drain D of a corresponding one of the first pass transistors TR1 and TR4 through the fourth contact C11.

The fourth coupling lines S2 may have the first direction FD as the lengthwise direction thereof, and may be disposed within the first direction pitches P2 and P3 of the second pass transistors TR2 and TR3 respectively corresponding thereto. Each of the fourth coupling lines S2 may overlap with a corresponding one of the second coupling lines T2 in the vertical direction VD. At least one fifth contact C22 which passes through the second dielectric layer ILD2 may be formed where each of the fourth coupling lines S2 and a corresponding one of the second coupling lines T2 overlap with each other. Each of the fourth coupling lines S2 may be coupled to a corresponding one of the second coupling lines T2 through the fifth contact C22.

The fourth coupling lines S2 may overlap with the drains D of the second pass transistors TR2 and TR3 respectively corresponding thereto in the vertical direction VD. At least one sixth contact C12 which passes through the first dielectric layer ILD1 may be formed where each of the fourth coupling lines S2 and the drain D of a corresponding one of the second pass transistors TR2 and TR3 overlap with each other. Each of the fourth coupling lines S2 may be coupled to the drain D of a corresponding one of the second pass transistors TR2 and TR3 through the sixth contact C12.

Referring to FIGS. 4, 6, 7 and 8, metal lines 400 may be disposed at the first wire layer L1. The metal lines 400 may be electrically coupled with a peripheral circuit (200 of FIG. 3) and planes (PLANE1 to PLANE4 of FIG. 3), and may play the role of transferring signals between the peripheral circuit and the planes.

The metal lines 400 may be disposed in the first direction pitches P2 and P3 of the second pass transistors TR2 and TR3. The metal lines 400 may overlap with the second pass transistors TR2 and TR3 in the vertical direction VD. No metal line disposed in each of the first direction pitches P1 and P4 of the first pass transistors TR1 and TR4, and each of the metal lines 400 does not overlap with each of the first pass transistors TR1 and TR4 in the vertical direction VD.

In short, any one kind of lines among global lines and metal lines are disposed in each of the first direction pitches P1 to P4 of the pass transistors TR1 to TR4. Therefore, when compared to the case where global lines and metal lines are mixed in the first direction pitch of a single pass transistor, it possible to increase the gap between a metal line and a global line. In particular, in the case where at least two second pass transistors are successively disposed along the first direction FD between adjacent first pass transistors, the gap between a metal line and a global line may be further increased when compared to the case where only one second pass transistor is disposed between adjacent first pass transistors.

The metal lines 400 may include signal lines 410 and power lines 420. The power lines 420 may transmit power signals such as a power supply voltage and a ground voltage. The signal lines 410 may transmit signals other than power, such as, for example, data, a command and an address. The signals transmitted through the signal lines 410 may be more sensitively influenced by coupling capacitance than the operating voltages transmitted through the global lines GWL1 to GWL4. The power transmitted through the power lines 420 may be more insensitive to the influence of coupling capacitance than the operating voltages transmitted through the global lines GWL1 to GWL4.

A gap F2 (see FIG. 6) between the signal line 410 and the power line 420 which neighbor each other may be set larger than a gap F1 (see FIG. 6) between the global line GWL3 and the power line 420 which neighbor each other.

In the case where the gap between the signal lines 410 and the global lines GWL1 to GWL4 narrow, the coupling capacitance between the global lines GWL1 to GWL4 and the signal lines 410 may increase, and noise may occur in the signals transmitted through the signal lines 410, under the influence of the operating voltages transmitted through the global lines GWL1 to GWL4, whereby the signals may be distorted and a signal transfer speed may decrease. In the case where the gap between the power lines 420 and the global lines GWL1 to GWL4 narrow, the coupling capacitance between the global lines GWL1 to GWL4 and the power lines 420 may increase, and the levels of the operating voltages transmitted through the global lines GWL1 to GWL4 may be undesirably changed, under the influence of the power transmitted through the power lines 420.

Meanwhile, in the case where the gap between the signal lines 410 and the power lines 420 which neighbor each other is narrow, the coupling capacitance between the signal lines 410 and the power lines 420 may increase, and noise may occur in the signals loaded on the signal lines 410, under the influence of the power transmitted through the power lines 420, whereby the signals may be distorted and a signal transfer speed may decrease.

According to the present embodiment, since the gap between the global lines GWL1 to GWL4 and the signal lines 410 may be increased, the coupling capacitance between the global lines GWL1 to GWL4 and the signal lines 410 may be reduced, and thus, the distortion of the signals loaded on the signal lines 410 may be prevented and a signal transfer speed may be increased. Further, since the gap between the global lines GWL1 to GWL4 and the power lines 420 may be increased, the coupling capacitance between the global lines GWL1 to GWL4 and the power lines 420 may be reduced, and thus, an undesirable level change of the operating voltages loaded on the global lines GWL1 to GWL4 may be suppressed and the levels of the operating voltages may be stabilized.

Moreover, because the gap between the signal line 410 and the power line 420 which neighbor each other larger than the gap between the global line GWL3 and the power line 420 which neighbor each other, the coupling capacitance between the signal line 410 and the power line 420 which are adjacent to each other may be reduced, and thus, the distortion of the signal loaded on the signal line 410 may be prevented and a signal transfer speed may be increased.

Figure 9:
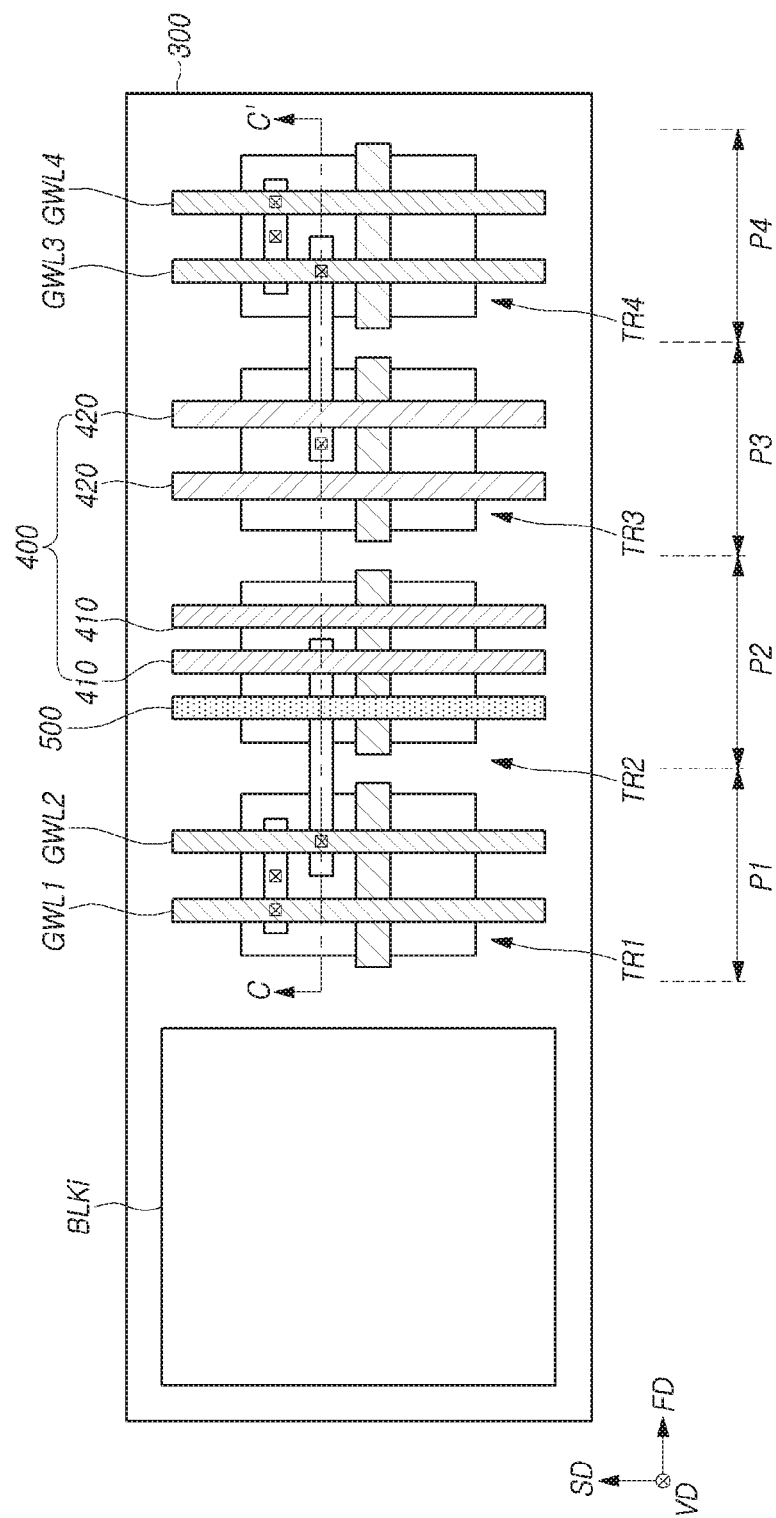
FIG. 9 a layout diagram illustrating a part of a row decoder in accordance with an embodiment of the present invention.
Figure 10:
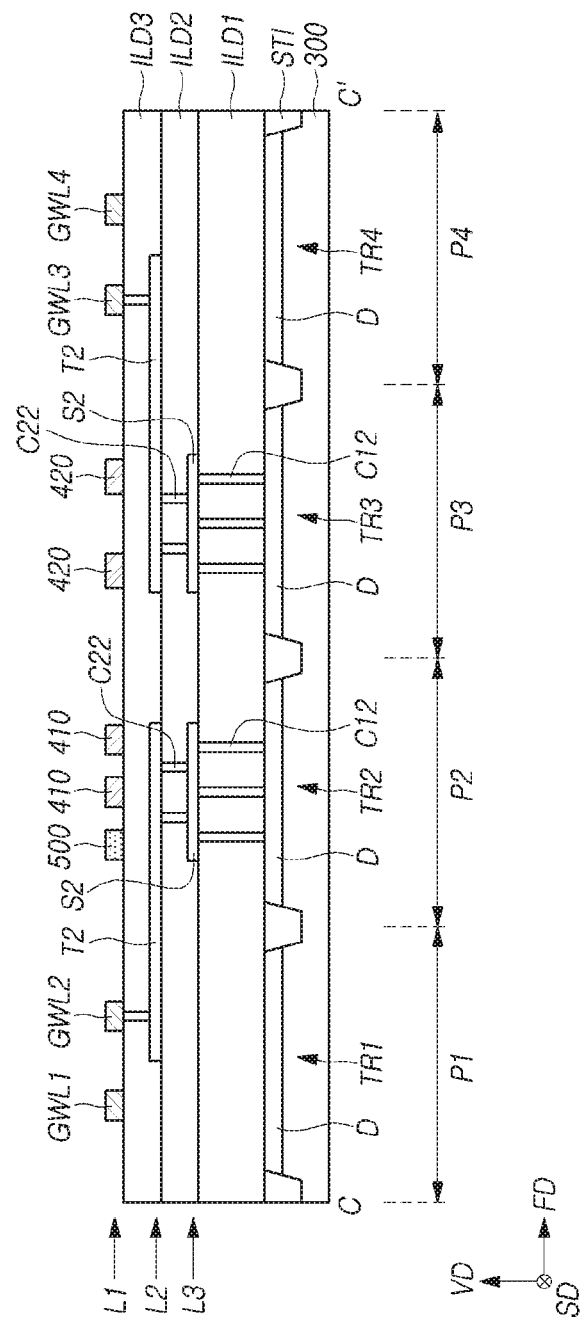
FIG. 10 a cross-sectional view taken along the line C-C' of FIG. 9.

FIG. 9 a layout diagram illustrating a part of a row decoder in accordance with an embodiment, and FIG. 10 a cross-sectional view taken along the line C-C' of FIG. 9.

In an embodiment to be described below with reference to FIGS. 9 and 10, the same technical terms and the same reference numerals will be used to refer to substantially the same components as the components of the embodiment described above with reference to FIGS. 4 to 8, and repeated descriptions for the same components will be omitted herein.

Referring to FIGS. 9 and 10, at least one shielding line 500 may be formed at the same wire layer as global lines GWL1 to GWL4, signal lines 410 and power lines 420, that is, a first wire layer L1. The shielding line 500 may be disposed adjacent to the signal lines 410 and extend in the second direction SD.

In the case where a signal line 410 and a global line GWL neighbor each other, the shielding line 500 may be disposed between the signal line 410 and the global line GWL which neighbor each other. The gap between the shielding line 500 and the adjacent signal line 410 may have a space according to a minimum design rule. A ground voltage may be applied to the shielding line 500.

Since the shielding line 500 disposed between the signal line 410 and the global line GWL which neighbor each other, a coupling phenomenon between the signal line 410 and the global line GWL may be suppressed, and the distortion of the signal loaded on the signal line 410 may be prevented.

As apparent from the above descriptions, according to the embodiments, since metal lines are disposed on the same wire layer as global lines in such a way as to overlap with pass transistors, it is not necessary to increase an area or add a separate wire layer to dispose the metal lines, whereby it possible to decrease the size of a semiconductor memory device. Moreover, since the gap between global lines and metal lines may be increased, the coupling capacitance between the global lines and the metal lines may be reduced, and thus, the distortion of signals transmitted through the metal lines and the global lines may be prevented, whereby it is possible to improve the operation characteristics and reliability of the semiconductor memory device.

Figure 11:
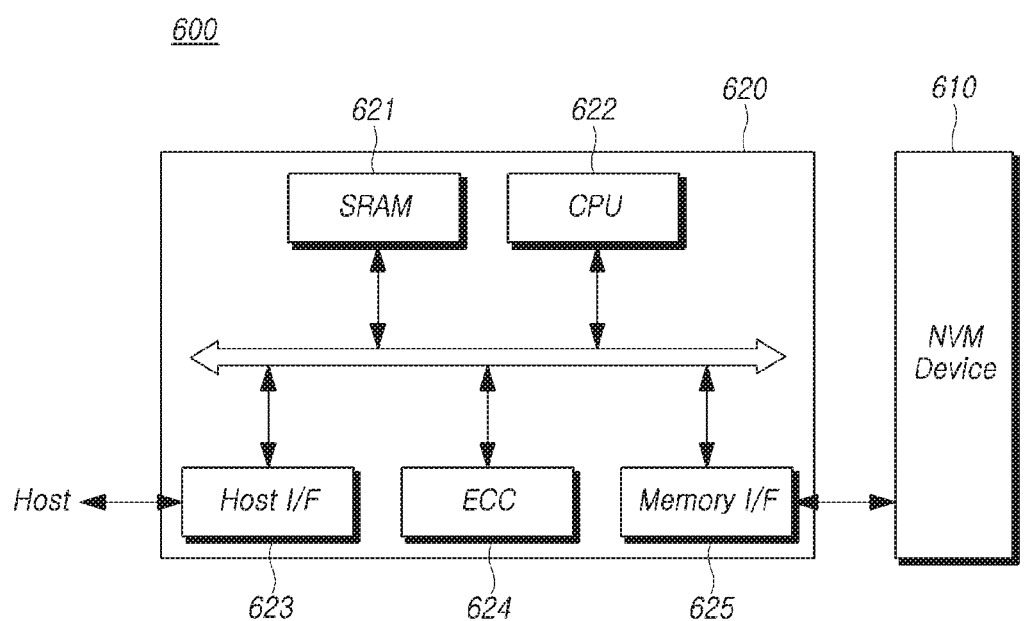
FIG. 11 a diagram schematically illustrating a memory system including a semiconductor memory device in accordance with an embodiment of the present invention.

FIG. 11 a simplified block diagram schematically illustrating a memory system including a memory device according to an embodiment of the present invention.

Referring to FIG. 11, the memory system 600 may include the semiconductor memory device 610 and a memory controller 620.

The semiconductor memory device 610 may be comprised the memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid-state disk (SSD). The memory controller 620 may include an SRAM 621, a central processing unit (CPU) 622, a host interface 623, an ECC block 624, and a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The nonvolatile memory device may be provided for a memory system such as a solid-state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol, and an IDE (integrated device electronics) protocol and the like.

Figure 12:
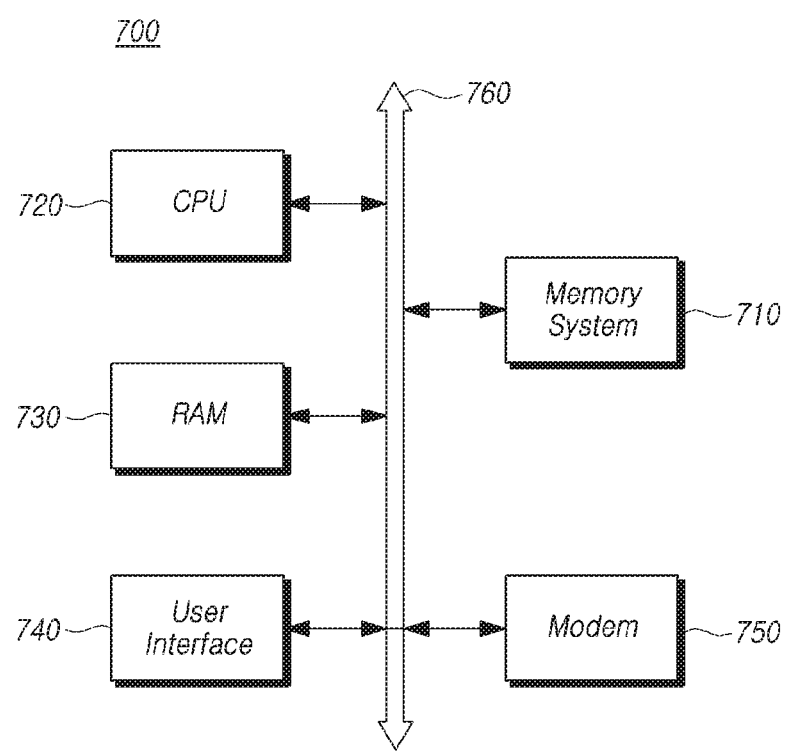
FIG. 12 a simplified block diagram schematically illustrating a computing system including a semiconductor memory device in accordance with an embodiment of the present invention.

FIG. 12 a simplified block diagram schematically illustrating a computing system including a memory device, according to an embodiment of the present invention.

Referring to FIG. 12, a computing system 700 according to an embodiment may include a memory system 710, a microprocessor (or CPU) 720, a RAM 730, a user interface 740, and a modem 750 such as a baseband chipset, those of which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a CAMS image sensor (CIS), a mobile DRAM, and so on. The memory system 710 may be configured, for example, as an SSD (solid state drive/disk) which uses a nonvolatile memory to store data. Also, as an example, the memory system 710 may be provided as a fusion flash memory (for example, a NAND or a NOR flash memory).

It not that the above-described embodiments are realized only by a device and a method, and they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a plurality of pass transistors disposed along a first direction over a substrate, and configured to transfer operating voltages to a memory cell array; and
a plurality of global lines formed in a first wire layer over the pass transistors, extending in a second direction intersecting with the first direction, and configured to transfer the operating voltages to the corresponding pass transistors respectively,
wherein the global lines are disposed in only some pass transistors pitches in the first direction, and
wherein at least one of remaining pass transistors except for the some pass transistors is disposed along the first direction between two successive ones of the some pass transistors.

2. The semiconductor memory device according to claim 1, wherein the global lines overlap with the some pass transistors in a vertical direction that is perpendicular to a top surface of the substrate, and do not overlap with the remaining pass transistors.

3. The semiconductor memory device according to claim 2, wherein at least two of the remaining pass transistors are successively disposed along the first direction.

4. The semiconductor memory device according to claim 1, further comprising:
metal lines extending in the second direction and configured to transmit signals other than the operating voltages, the metal lines being disposed in first direction pitches of the remaining pass transistors.

5. The semiconductor memory device according to claim 4, wherein the metal lines overlap with the remaining pass transistors in the vertical direction that is perpendicular to the top surface of the substrate, and do not overlap with the some pass transistors.

6. The semiconductor memory device according to claim 5, wherein the metal lines comprise:
power lines configured to transmit power; and
signal lines configured to transmit signals other than power.

7. The semiconductor memory device according to claim 6, further comprising:
a shielding line formed in the first wire layer, and disposed adjacent to the signal lines.

8. The semiconductor memory device according to claim 7, wherein the shielding line is disposed between a signal line and a global line which neighbor each other in the first direction.

9. The semiconductor memory device according to claim 7, wherein a ground voltage is provided to the shielding line.

10. The semiconductor memory device according to claim 1,
wherein the global lines comprise:
first global lines corresponding respectively to the some pass transistors; and
second global lines corresponding respectively to the remaining pass transistors, and
wherein each of the first global lines is disposed in the first direction pitch of a corresponding pass transistor.

11. The semiconductor memory device according to claim 10, further comprising:
first coupling lines formed in a second wire layer between the pass transistors and the first wire layer, and each electrically coupled with a corresponding one of the some pass transistors and a corresponding one of the first global lines; and second coupling lines formed in the second wire layer, and each electrically coupled with a corresponding one of the remaining pass transistors and a corresponding one of the second global lines, wherein each of the second coupling lines extends from an inside of the first direction pitch of a corresponding one of the remaining pass transistors to an inside of the first direction pitch of a corresponding one of the some pass transistors.

12. The semiconductor memory device according to claim 11, wherein each of the first coupling lines is disposed in the first direction pitch of a corresponding one of the some pass transistors.

13. A semiconductor memory device comprising:
a plane disposed over a substrate, and including a memory cell array and a row decoder; and
a peripheral circuit disposed adjacent to the plane in a second direction intersecting with a first direction, over the substrate,
the row decoder comprising
a plurality of pass transistors disposed along the first direction, and configured to transfer operating voltages to the memory cell array; and
a plurality of global lines formed in a first wire layer over the pass transistors, extending in the second direction, and configured to transfer the operating voltages to the corresponding pass transistors respectively,
wherein the global lines are disposed in first direction pitches of some pass transistors among the pass transistors, and are not disposed in first direction pitches of remaining pass transistors, and
wherein at least one of the remaining pass transistors is disposed along the first direction between two successive ones of the some pass transistors.

14. The semiconductor memory device according to claim 13, further comprising:
a plurality of metal lines formed in the first wire layer, extending in the second direction, and configured to electrically couple the plane and the peripheral circuit,
wherein the metal lines are disposed in the first direction pitches of the remaining pass transistors, and are not disposed in the first direction pitches of the pass transistors.

15. The semiconductor memory device according to claim 13, wherein at least two of the remaining pass transistors are successively disposed along the first direction.

16. The semiconductor memory device according to claim 13,
wherein the global lines comprise:
first global lines corresponding respectively to the some pass transistors; and
second global lines corresponding respectively to the remaining pass transistors except the some pass transistors, and
wherein each of the first global lines is disposed in the first direction pitch of a corresponding pass transistor.

17. The semiconductor memory device according to claim 16, further comprising:
first coupling lines formed in a second wire layer between the pass transistors and the first wire layer, and each electrically coupled with a corresponding one of the pass transistors and a corresponding one of the first global lines; and
second coupling lines formed in the second wire layer, and each electrically coupled with a corresponding one of the remaining pass transistors and a corresponding one of the second global lines,
wherein each of the second coupling lines extends from an inside of the first direction pitch of a corresponding one of the remaining pass transistors, to an inside of the first direction pitch of a corresponding one of the pass transistors.

18. A semiconductor memory device comprising:
a plurality of pass transistors disposed along a first direction over a substrate, and configured to transfer operating voltages to a memory cell array;
a plurality of global lines formed in a first wire layer over the pass transistors, extending in a second direction intersecting with the first direction, and configured to transfer the operating voltages to the corresponding pass transistors respectively; and
a plurality of metal lines formed in the first wire layer, and extending in the second direction,
wherein the global lines and the metal lines overlap with the pass transistors in a vertical direction that is perpendicular to a top surface of the substrate, and only any one kind of lines among the global lines and the metal lines are disposed in the first direction pitch of each of the pass transistors,
wherein the pass transistors includes some pass transistors overlapped with the global lines in the vertical direction and remaining pass transistors overlapped with the metal lines in the vertical direction, and
wherein at least one of the remaining pass transistors is disposed along the first direction between two successive ones of the some pass transistors.

* * * * *